United States Patent
Hsiao

(10) Patent No.: US 7,719,306 B2
(45) Date of Patent: May 18, 2010

(54) OUTPUT BUFFER FOR AN ELECTRONIC DEVICE

(75) Inventor: Chao-Chih Hsiao, Taipei (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 43 days.

(21) Appl. No.: 12/168,160

(22) Filed: Jul. 7, 2008

(65) Prior Publication Data

US 2009/0243656 A1    Oct. 1, 2009

(30) Foreign Application Priority Data

Mar. 27, 2008   (TW) .............................. 97110981 A

(51) Int. Cl.
*H03K 3/00* (2006.01)
(52) U.S. Cl. .............................. 326/26; 326/83; 326/86; 327/108; 327/170; 327/112; 327/391
(58) Field of Classification Search .................. 326/26, 326/27, 81, 83, 86, 87; 327/108, 112, 391
See application file for complete search history.

(56) References Cited

U.S. PATENT DOCUMENTS

| | | | | |
|---|---|---|---|---|
| 5,118,971 A | * | 6/1992 | Schenck | 326/32 |
| 5,428,303 A | * | 6/1995 | Pasqualini | 326/27 |
| 5,568,081 A | * | 10/1996 | Lui et al. | 327/380 |
| 5,959,468 A | * | 9/1999 | Wendell et al. | 326/83 |
| 6,720,802 B2 | * | 4/2004 | Cho | 327/108 |
| 7,005,897 B2 | * | 2/2006 | Lim | 327/112 |
| 7,312,626 B2 | * | 12/2007 | Forbes | 326/26 |
| 7,330,053 B2 | * | 2/2008 | Brucke et al. | 326/83 |
| 7,456,663 B2 | * | 11/2008 | Lim | 327/112 |
| 7,474,131 B1 | * | 1/2009 | Hoffmann et al. | 327/108 |

FOREIGN PATENT DOCUMENTS

WO    WO01/54278    *    7/2001    ............... 327/108

* cited by examiner

*Primary Examiner*—Vibol Tan
(74) *Attorney, Agent, or Firm*—Winston Hsu

(57) ABSTRACT

In order to reduce production cost, an output buffer for an electronic device includes a first logic unit, a second logic unit, a first transistor, a second transistor and a control unit. The first logic unit and the second unit are both coupled to an input terminal and conductions of the first logic unit and the second unit are controlled by an input signal from the input terminal. The control unit is coupled to the first logic unit, the second logic unit, the first transistor and the second transistor, for controlling the first transistor and the second transistor to conduct at different times for implementing the non-overlapping function.

20 Claims, 7 Drawing Sheets

OUTPUT BUFFER FOR AN ELECTRONIC DEVICE

BACKGROUND OF THE INVENTION

1. Field of the Invention

The present invention relates to an output buffer of an electronic device, and more particularly, to an output buffer for reducing production cost of the electronic device.

2. Description of the Prior Art

Output buffers are widely used in electronic devices to separate a signal input terminal and a signal output terminal, for decreasing influences from the load and enhancing driving capability. Please refer to FIG. 1, which is a schematic diagram of an output buffer 10 according to the prior art. The output buffer 10 comprises an input terminal 100, an OR gate 102, an AND gate 104, delay cells 106, 108, a p-type metal-oxide-semiconductor (PMOS) transistor 110, an n-type metal-oxide-semiconductor (NMOS) transistor 112 and an output terminal 114. The OR gate 102 is utilized for performing an OR operation on an input signal SI from the input terminal 100 and a gate control signal VN from the delay cell 108, for outputting an operation result to the delay cell 106. The delay cell 106 delays the output of the operation result, for generating a gate control signal VP. Similarly, the AND gate 104 is utilized for performing an AND operation on the input signal SI and the gate control signal VP from the delay cell 106, for outputting an operation result to the delay cell 108. The delay cell 108 delays the output of the operation result, for generating the gate control signal VN. The gate control signal VP and VN controls the conduction of the PMOS transistor 110 and the NMOS transistor 112 for generating an output signal SO. The output terminal 114 outputs the output signal SO to the load.

Please refer to FIG. 2, which is a timing diagram of the input signal SI, the output signal SO, the gate control signal VP and VN. As shown in FIG. 2, by using the OR gate 102 and the delay cell 106, the PMOS transistor 110 first conducts according to the gate control signal VP at a time point T2, then by using the AND gate and the delay cell 108, the NMOS transistor 112 conducts according to the gate control signal VN at a time point T3. In other words, the PMOS transistor 110 and the NMOS transistor 112 conduct and turn off at different times so as to implement the non-overlapping output function. A lot of components are required to implement the OR gate 102, the AND gate 104, the delay cells 106 and 108, however. As a result, production cost of the output buffer 10 cannot be reduced.

SUMMARY OF THE INVENTION

It is therefore a primary objective of the claimed invention to provide an output buffer for an electronic device, for reducing production cost of the electronic device.

The present invention discloses an output buffer for an electronic device, which comprises a first logic unit, a second logic unit, a first transistor, a second transistor and a control unit. The first logic unit comprises a first terminal, a second terminal coupled to a power supply terminal, and a third terminal, and is utilized for controlling an electrical connection between the second terminal of the first logic unit and the third terminal of the first logic unit according to an input signal from the first terminal of the first logic unit. The second logic unit comprises a first terminal coupled to the first terminal of the first logic unit, a second terminal coupled to a ground terminal, and a third terminal, and is utilized for controlling an electrical connection between the third terminal of the second logic unit and the second terminal of the second logic unit according to the input signal from the first terminal of the second logic unit. The first transistor comprises a first terminal coupled to the third terminal of the first logic unit, a second terminal coupled to a power supply terminal, and a third terminal, and is utilized for controlling an electrical connection between the second terminal of the first transistor and the third terminal of the first transistor according to a signal from the first terminal of the first transistor. The second transistor comprises a first terminal coupled to the third terminal of the second logic unit, a second terminal coupled to the ground terminal, and a third terminal, and is utilized for controlling an electrical connection between the third terminal of the second transistor and the second terminal of the second transistor according to a signal from the first terminal of the second transistor. The control unit is coupled to the third terminal of the first logic unit, the third terminal of the second logic unit, the first terminal of the first transistor and the first terminal of the second transistor, and is utilized for controlling a conduction order of the first transistor and the second transistor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
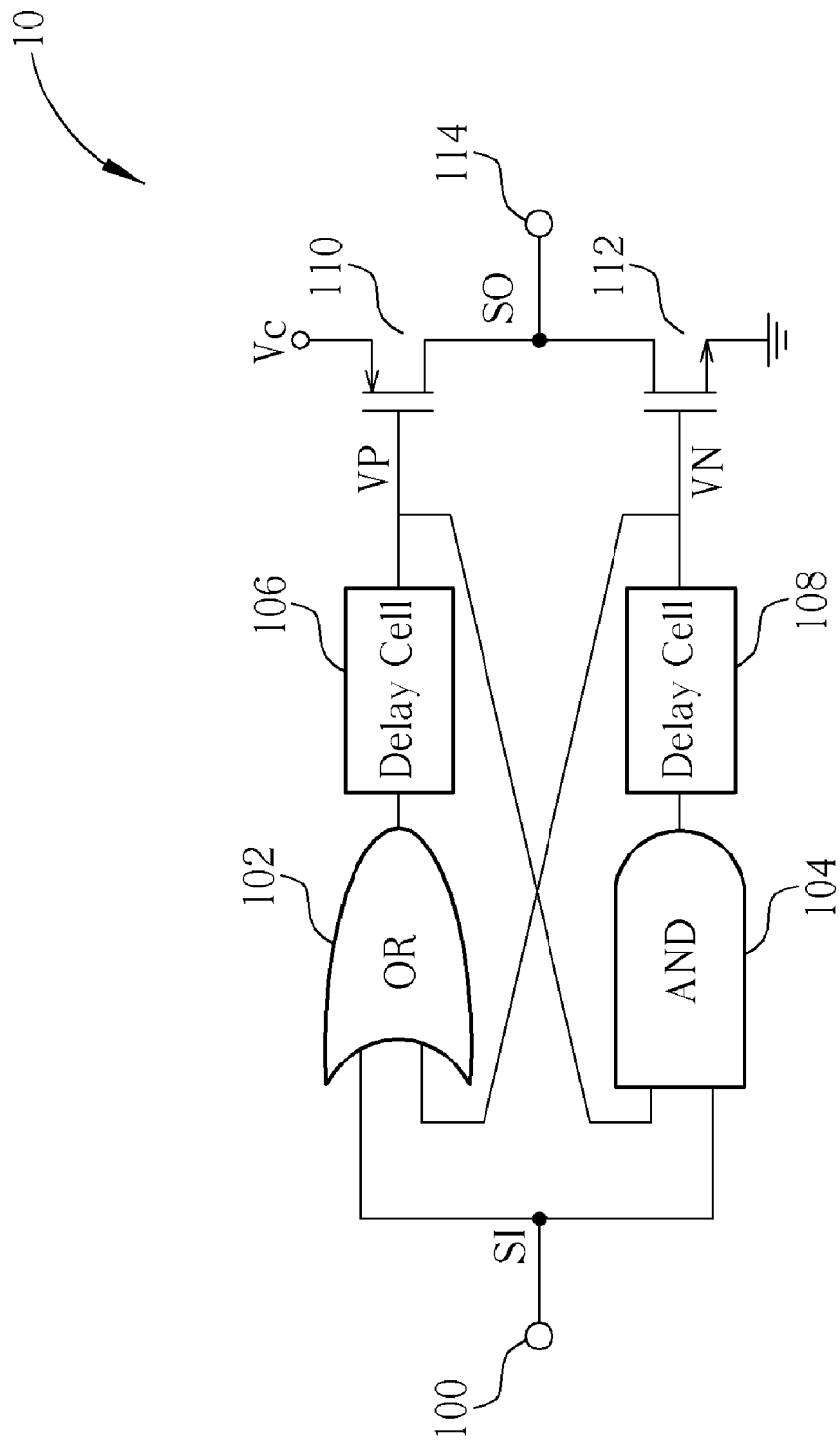
FIG. 1 is a schematic diagram of an output buffer according to the prior art.
Figure 2:
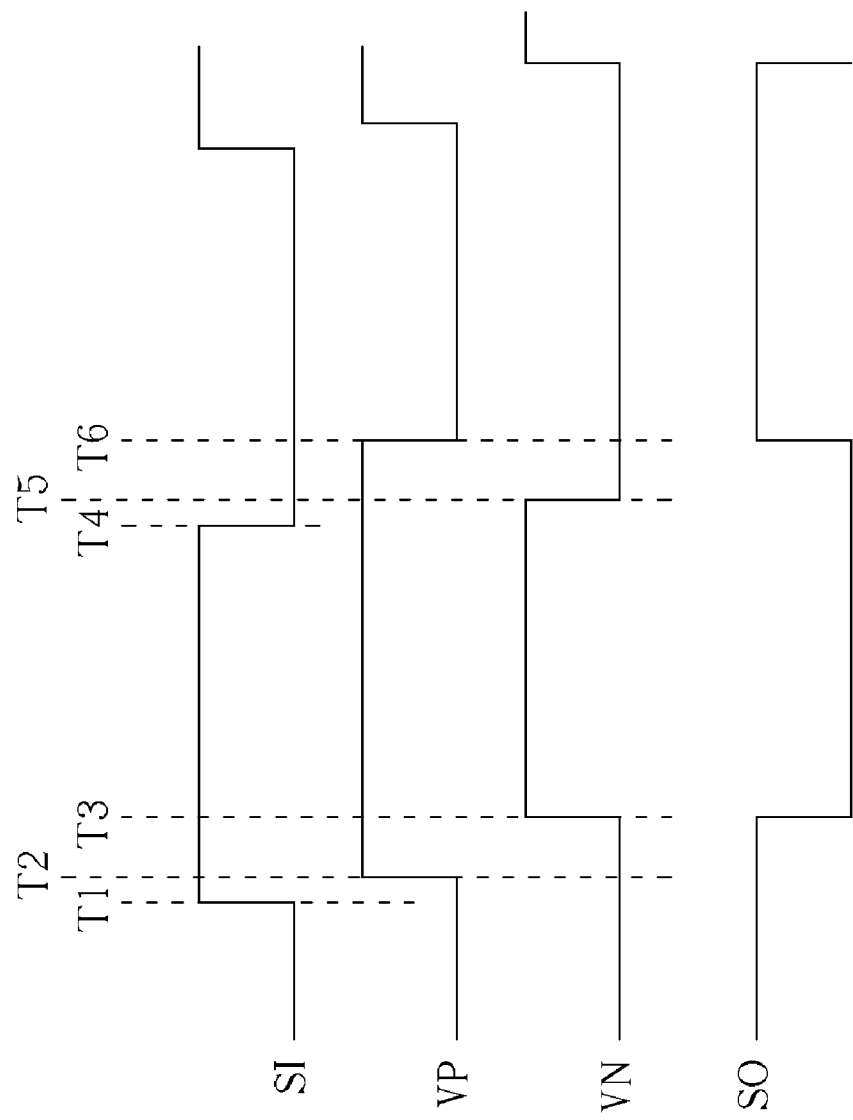
FIG. 2 is a timing diagram of the output buffer shown in FIG. 1.
Figure 3:
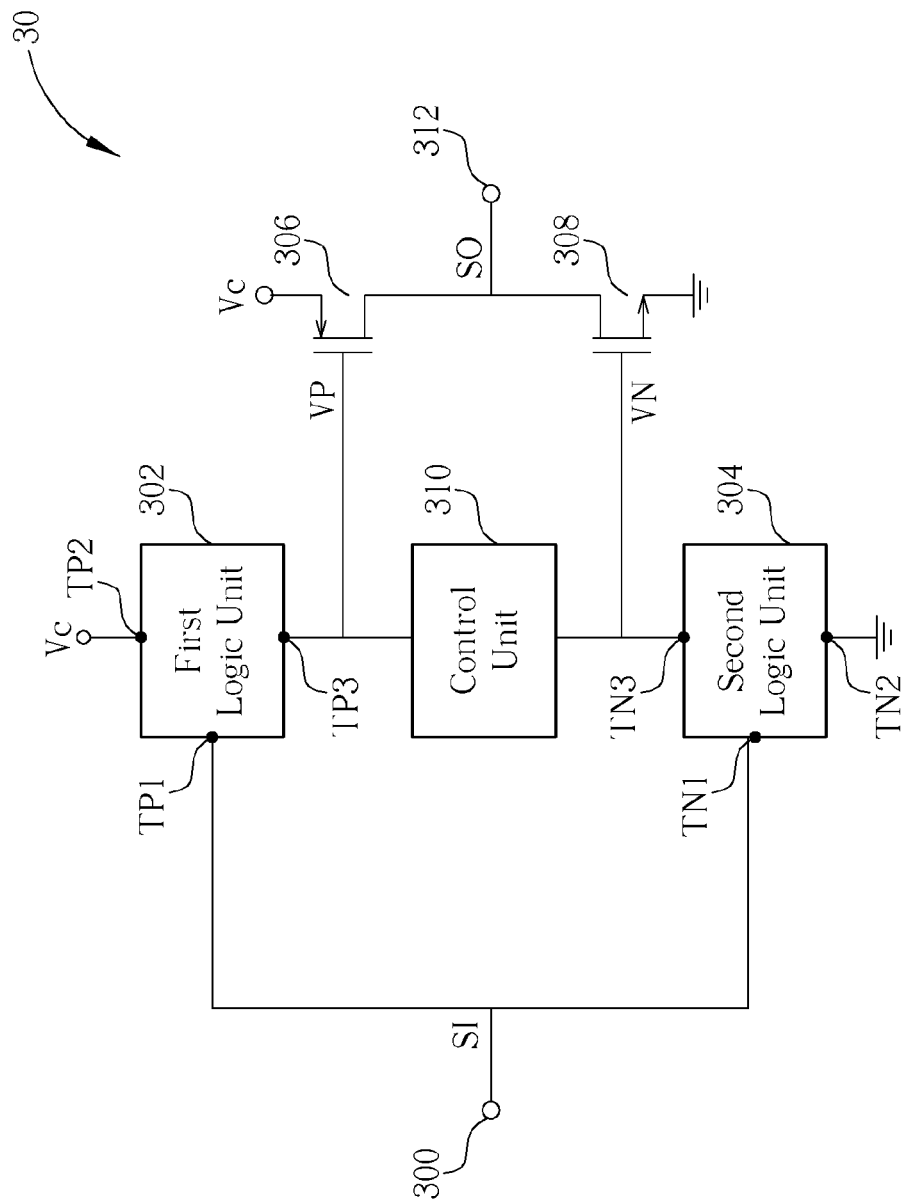
FIG. 3 to FIG. 6 are schematic diagrams of output buffers according to embodiments of the present invention.

Please refer to FIG. 3, which is a schematic diagram of an output buffer 30 according to an embodiment of the present invention. The output buffer 30 comprises an input terminal 300, a first logic unit 302, a second logic unit 304, a PMOS transistor 306, an NMOS transistor 308, a control unit 310 and an output terminal 312. The output buffer 30 receives an input signal SI via the input terminal 300, and outputs an output signal SO via the output terminal 312 after related processes. In FIG. 3, the first logic unit 302 is a 3-terminals component and the 3 terminals of the first logic unit 302 are marked as TP1, TP2 and TP3. The terminal TP1 is coupled to the input terminal 300; the terminal TP2 is coupled to a power supply terminal Vc; and the terminal TP3 is coupled to a gate of the PMOS transistor 306 and the control unit 310. The first logic unit 302 is utilized for controlling an electrical connection between the terminal TP2 and the terminal TP3 according to the input signal SI so as to output a gate control signal VP to the gate of the PMOS transistor 306. Similarly, the second logic unit 304 is also a 3-terminals component and the 3 terminals of the second logic unit 304 are marked as TN1, TN2 and TN3. The terminal TN1 is coupled to the input terminal 300; the terminal TN2 is coupled to a ground terminal; and the terminal TN3 is coupled to a gate of the NMOS transistor 308 and the control unit 310. The second logic unit 304 is utilized for controlling an electrical connection between the terminal TN3 and the terminal TN2 according to the input signal SI so as to output a gate control signal VN to the gate of the NMOS transistor 308.

The PMOS transistor 306 has a gate coupled to the terminal TP3, a source coupled to the power supply terminal Vc and a drain coupled to the output terminal 312, and is utilized for controlling an electrical connection between the source of the PMOS transistor 306 and the drain of the PMOS transistor 306 according to the gate control signal VP. The NMOS transistor 308 has a gate coupled to the terminal TN3, a source coupled to the ground terminal and a drain coupled to the output terminal 312, and is utilized for controlling an electrical connection between the drain of the NMOS transistor 308 and the source of the NMOS transistor 308 according to the gate control signal VN. In addition, the control unit 310 is coupled to the terminal TP3 and the terminal TN3 and is utilized for controlling a conduction order of the PMOS transistor 306 and the NMOS transistor 308. Preferably, the control unit 310 controls the PMOS transistor 306 and the NMOS transistor 308 to conduct at different times so as to control the voltage of the output signal SO. Therefore, the output buffer 30 is a non-overlapping output buffer.

The operation of the output buffer 30 is described as follows. In the embodiment of the present invention, the voltage level of the power supply terminal Vc is high and the voltage level of the ground terminal is low. When the input signal SI is high, the electrical connection between the terminal TP2 and the terminal TP3 is not conductive, and the electrical connection between the terminal TN3 and the terminal TN2 is conductive, so that the gate control signal VN and the gate control signal VP are low. Thereby, the NMOS transistor 308 is cut off and the PMOS transistor 306 conducts so that the output signal SO is high.

When the input signal SI transfers from high to low, the electrical connection between the terminal TP2 and the terminal TP3 is conductive, and the electrical connection between the terminal TN3 and the terminal TN2 is not conductive, so that the gate control signal VP transfers to high. Therefore, the PMOS transistor 306 is cut off. Meanwhile, the control unit 310 controls the gate control signal VN to transfer to high later than the gate control signal VP, thereby the NMOS transistor 308 conducts and the output signal SO transfers from high to low. Next, when the input signal SI transfers from low to high, the electrical connection between the terminal TP2 and the terminal TP3 is not conductive, and the electrical connection between the terminal TN3 and the terminal TN2 is conductive, so that the gate control signal VN transfers to low and the NMOS transistor 308 is cut off. Meanwhile, the control unit 310 controls the gate control signal VP to transfer to low later than the gate control signal VN. Therefore, the PMOS transistor 306 conducts. As a result, the output signal SO transfers from low to high.

Please note that the output buffer 30 is one embodiment of the present invention, and those skilled in the art can make alterations and modifications accordingly. In FIG. 3, the first logic unit 302 is implemented with a PMOS transistor and the second logic unit 304 is implemented with an NMOS transistor. The first logic unit 302 can be composed of other components that control the electrical connection between the terminal TP2 and the terminal TP3 according to the input signal SI. Similarly, the second logic unit 304 can also be composed of other components that control the electrical connection between the terminal TN3 and the terminal TN2 according to the input signal SI.

From the above, it is demonstrated that the present invention controls the PMOS transistor 306 and the NMOS transistor 308 to conduct at different times via the control unit 310, so as to implement the non-overlapping output function.

Figure 4:
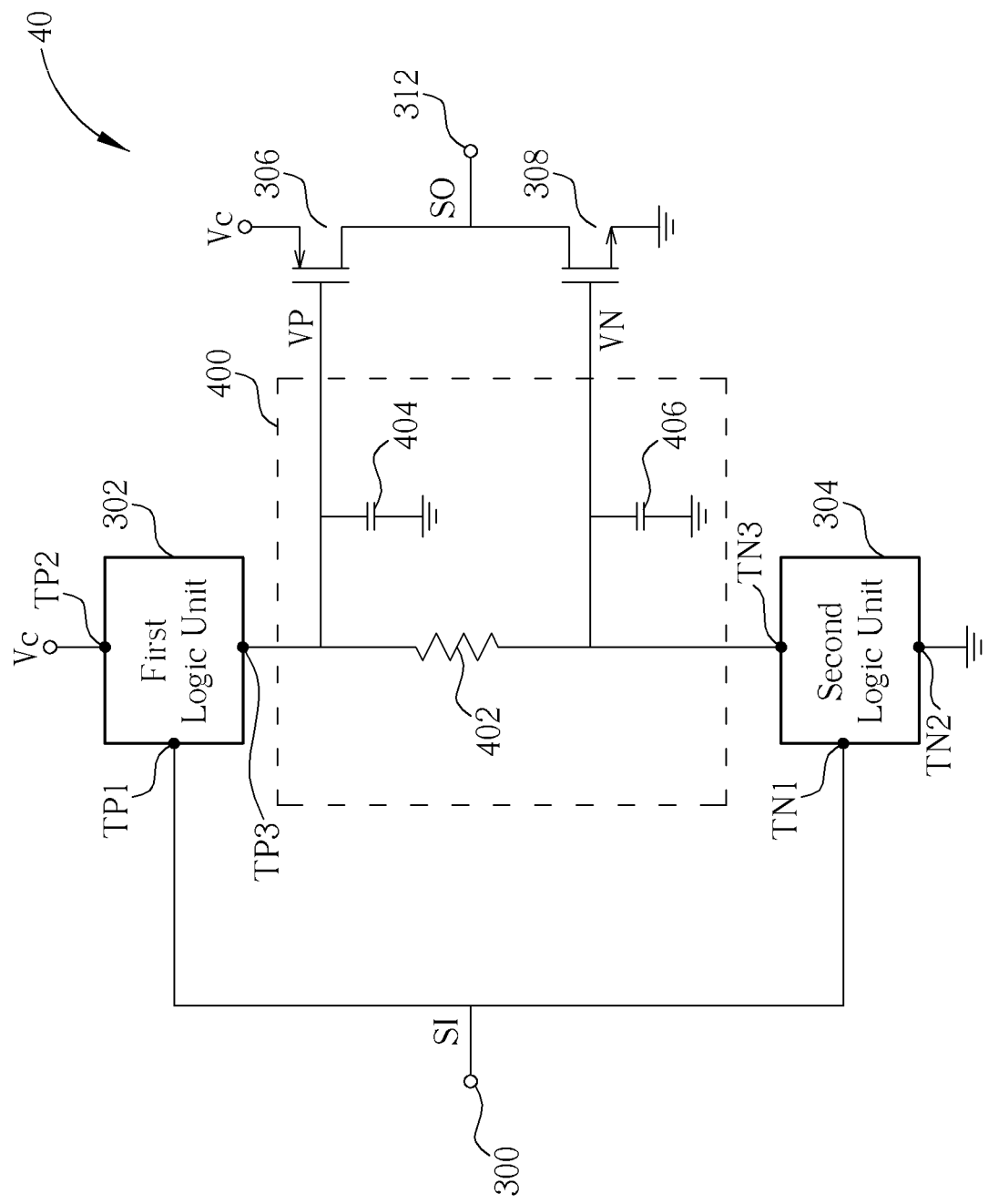

Note that the prior art output buffer 10 is implemented with a lot of transistors. Compared with the prior art, the control unit 310 is implemented with different kinds of circuits to reduce the number of components and costs. For an illustration of this, please refer to FIG. 4, which is a schematic diagram of an output buffer 40 according to an embodiment of the present invention. The output buffer 40 is similar to the output buffer 30. The difference being that the control unit 310 in FIG. 3 is replaced with the control unit 400. The control unit 400 comprises a resistor 402, capacitors 404 and 406. The resistor 402 is coupled between the terminal TP3 and the terminal TN3; the capacitor 404 is coupled between the terminal TP3 and the ground terminal; and the capacitor 406 is coupled between the terminal TN3 and the ground terminal. The output buffer 40 utilizes the charge and discharge effect of the resistor 402 and capacitors 404 and 406 to delay the signals. The control unit 400 controls the gate control signal VP and the gate control signal VN to transfer voltage level at different times as a result of the RC effect of the resistor and the capacitors.

Figure 5:
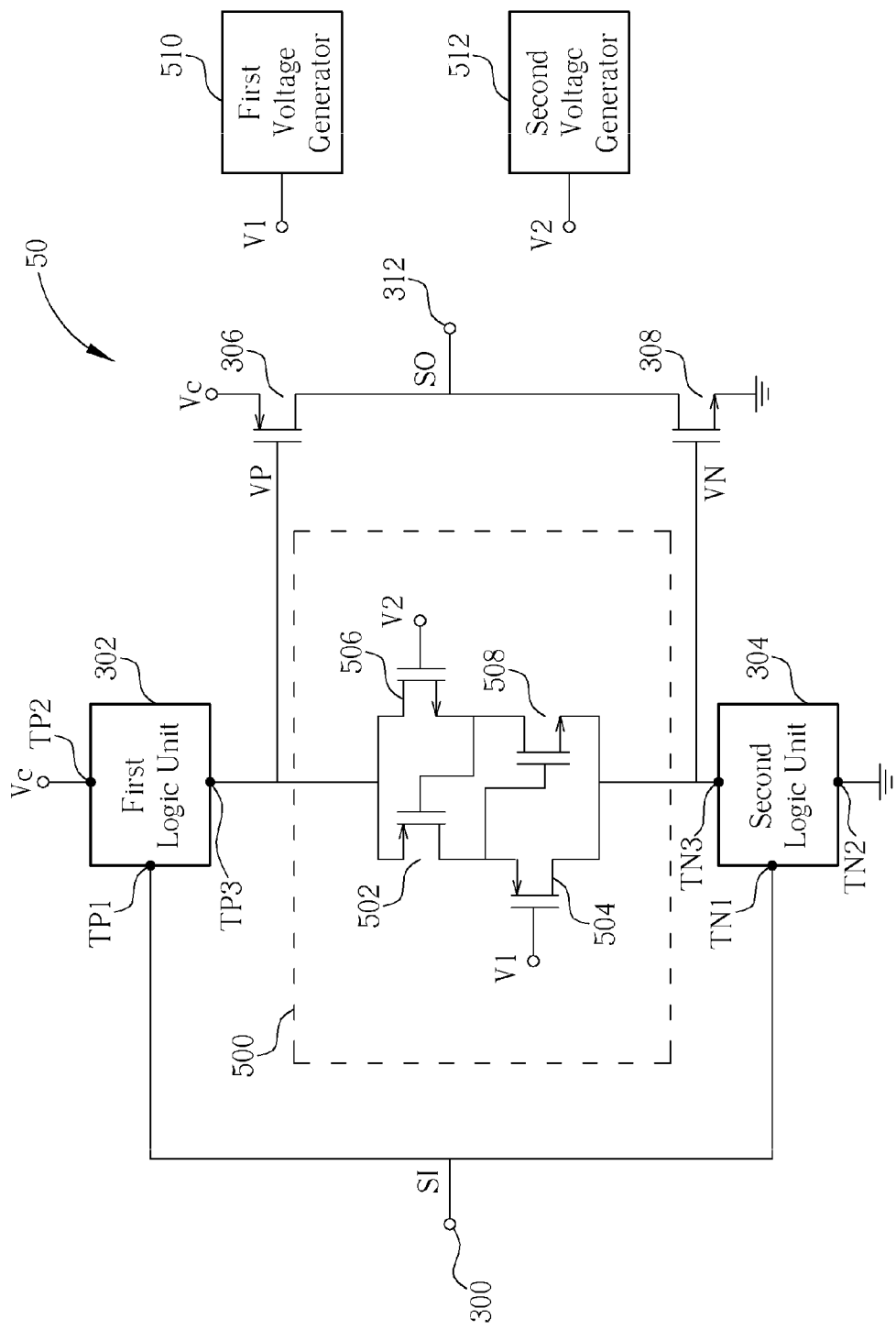

Please refer to FIG. 5, which is a schematic diagram of an output buffer 50 according to an embodiment of the present invention. The output buffer 50 is similar to the output buffer 30. The difference is that the control unit 310 in FIG. 3 is replaced with the control unit 500. The control unit 500 comprises PMOS transistors 502, 504, and NMOS transistors 506 and 508. The PMOS transistor 502 and 504 are connected in series. A source of the PMOS transistor 502 is coupled to the terminal TP3; a drain of the PMOS transistor 504 is coupled to the terminal TN3; and a gate of the PMOS transistor 504 is coupled to a first voltage generator 510. Similarly, the NMOS transistor 506 and 508 are connected in series. A drain of the NMOS transistor 506 is coupled to the terminal TP3; a source of the NMOS transistor 508 is coupled to the terminal TN3; and a gate of the NMOS transistor 506 is coupled to the second voltage generator 512. The gate of the PMOS transistor 502 is coupled to the source of the NMOS transistor 506, and the gate of the NMOS transistor 508 is coupled to the source of the PMOS transistor 504.

Figure 6:
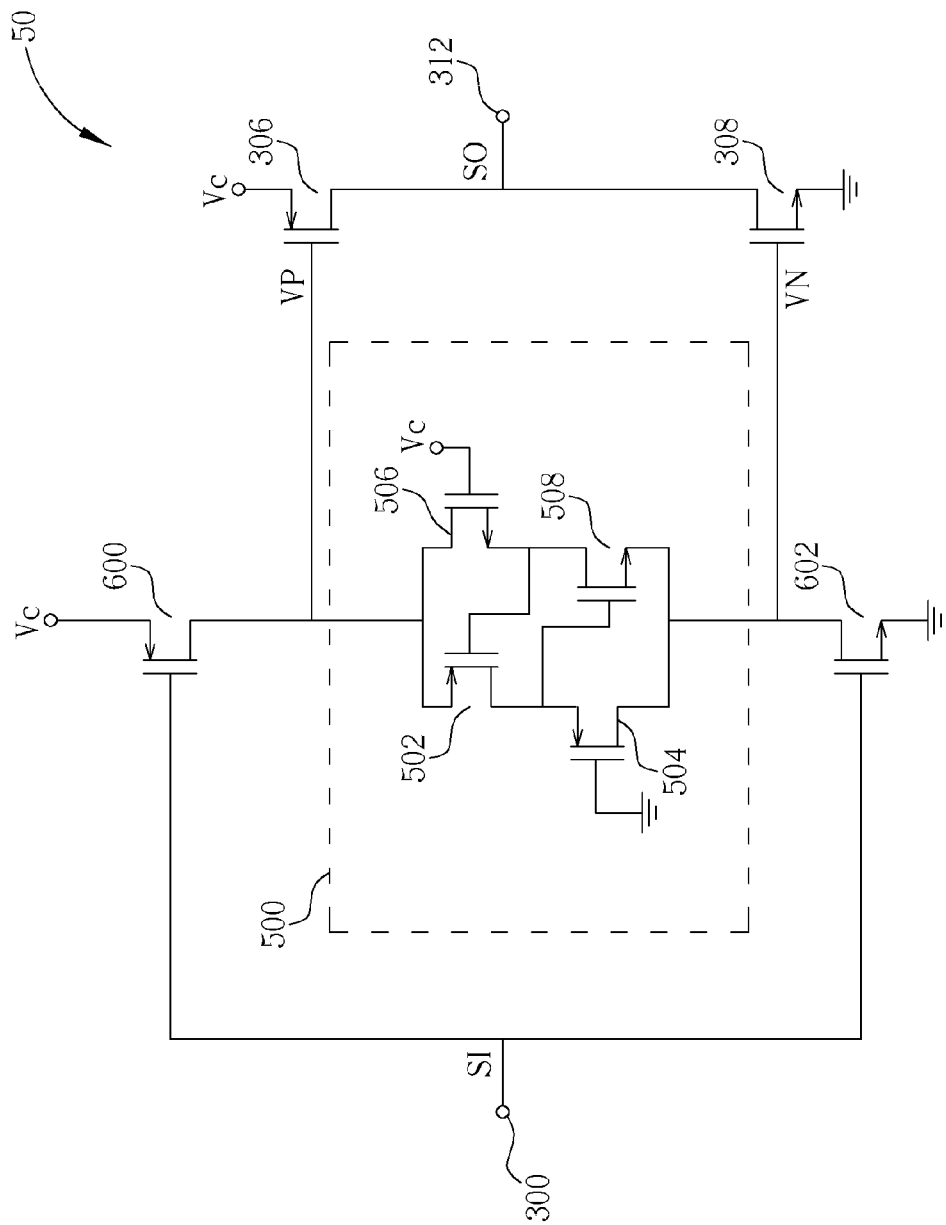

Note that, in FIG. 5, a first control signal V1 generated by a first voltage generator 510 is used for controlling the conduction of the PMOS transistor 504 and a second control signal V2 generated by a second voltage generator 512 is used for controlling the conduction of the NMOS transistor 506. The first control signal V1 and the second control signal V2 are at different voltage levels depending on circuit requirements. For an illustration of this, please refer to FIG. 6, which is a schematic diagram of the output buffer 50 with alterations. As shown in FIG. 6, when the first control signal V1 is fixed at the low voltage level and the second control signal V2 is fixed at the high voltage level, the PMOS transistor 504 and the NMOS transistor 506 always conduct. In this situation, the output buffer 50 is used for general purposes. When the first control signal V1 is fixed at the high voltage level and the second control signal V2 is fixed at the low voltage level, the PMOS transistor 504 and the NMOS transistor 506 are always cut off. In this situation, the output buffer 50 is a tri-state output buffer and has a high impedance output.

Figure 7:
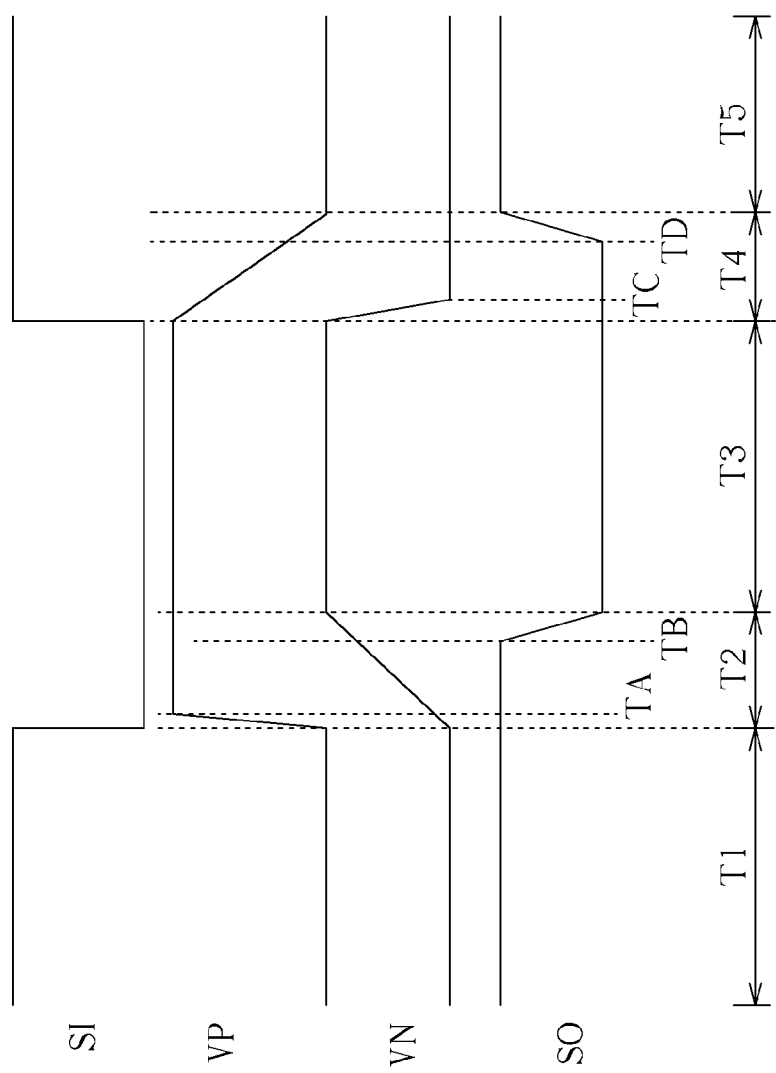
FIG. 7 is a timing diagram of the output buffer shown in FIG. 6.

As shown in FIG. 6, the first logic unit 302 is implemented with a PMOS transistor 600 and the second logic unit 304 is implemented with an NMOS transistor 602. The operation of the output buffer 50 in FIG. 6 is described as follows. Please refer to FIG. 7, which is a timing diagram of the input signal SI, the output signal SO, the gate control signal VP and VN in FIG. 6. During a period T1, the input signal SI is high, the PMOS transistor 600 is cut off, the NMOS transistor 602 conducts, and the gate control signal VN and VP are low. After the period T1, the input signal SI transfers from high to low so that the PMOS transistor 600 conducts and the NMOS transistor 602 is cut off. Next, during a period T2, the gate control signal VP transfers from low to high. The control unit 500 controls the gate control signal VN to transfer from low to high later than the gate control signal VP transfers, however. Therefore, the PMOS transistor 306 is cut off at a time point TA, and the NMOS transistor 308 conducts at a time point TB later than TA. The output signal SO starts to transfer to low at the time point TB.

Next, during a period T3, the input signal SI is low, the PMOS transistor 600 conducts and the NMOS transistor 602 is cut off, and the gate control signal VN and VP are high. After the period T3, the input signal SI transfers from low to high so that the NMOS transistor 602 conducts and the PMOS transistor 600 is cut off. Next, during a period T4, the gate control signal VN transfers from high to low. The control unit 500 controls the gate control signal VP to transfer from high to low later than the gate control signal VN transfers, however. Therefore, the NMOS transistor 308 is cut off at a time point TC and the PMOS transistor 306 conducts at a time point TD. The output signal SO starts to transfer to the high voltage level at the time point TD.

In conclusion, the present invention controls the PMOS transistor and the NMOS transistor coupled to the output terminal of the output buffer to conduct at different times according to the control unit so as to implement the non-overlapping output function. Moreover, the control unit is implemented with simple components. Therefore, production cost of the output buffer is reduced.

Those skilled in the art will readily observe that numerous modifications and alterations of the device and method may be made while retaining the teachings of the invention.

What is claimed is:

1. An output buffer for an electronic device comprising:
   a first logic unit comprising a first terminal, a second terminal coupled to a power supply terminal, and a third terminal, for controlling an electrical connection between the second terminal of the first logic unit and the third terminal of the first logic unit according to an input signal from the first terminal of the first logic unit;
   a second logic unit comprising a first terminal coupled to the first terminal of the first logic unit, a second terminal coupled to a ground terminal, and a third terminal, for controlling an electrical connection between the third terminal of the second logic unit and the second terminal of the second logic unit according to the input signal from the first terminal of the second logic unit;
   a first transistor comprising a first terminal coupled to the third terminal of the first logic unit, a second terminal coupled to a power supply terminal, and a third terminal, for controlling an electrical connection between the second terminal of the first transistor and the third terminal of the first transistor according to a signal from the first terminal of the first transistor;
   a second transistor comprising a first terminal coupled to the third terminal of the second logic unit, a second terminal coupled to the ground terminal, and a third terminal, for controlling an electrical connection between the third terminal of the second transistor and the second terminal of the second transistor according to a signal from the first terminal of the second transistor; and
   a control unit for controlling a conduction order of the first transistor and the second transistor, comprising:
   a resistor coupled between the third terminal of the first logic unit and the third terminal of the second logic unit;
   a first capacitor comprising one terminal coupled to the third terminal of the first logic unit and the resistor, and the other terminal coupled to the ground terminal; and
   a second capacitor comprising one terminal coupled to the third terminal of the second logic unit and the resistor, and the other terminal coupled to the ground terminal.

2. The output buffer of claim 1, further comprising an input terminal coupled to the first terminal of the first logic unit and the first terminal of the second logic unit, for generating the input signal.

3. The output buffer of claim 1, further comprising an output terminal coupled to the third terminal of the first logic unit and the third terminal of the second logic unit, for generating an output signal.

4. The output buffer of claim 1, wherein the first logic unit is a PMOS transistor having a gate as the first terminal of the first logic unit, a source as the second terminal of the first logic unit, and a drain as the third terminal of the first logic unit.

5. The output buffer of claim 1, wherein the second logic unit is an NMOS transistor having a gate as the first terminal of the second logic unit, a source as the second terminal of the second logic unit, and a drain as the third terminal of the second logic unit.

6. The output buffer of claim 1, wherein the first transistor is a PMOS transistor having a gate as the first terminal of the first transistor, a source as the second terminal of the first transistor, and a drain as the third terminal of the first transistor.

7. The output buffer of claim 1, wherein the second transistor is an NMOS transistor having a gate as the first terminal of the second transistor, a source as the second terminal of the second transistor, and a drain as the third terminal of the second transistor.

8. The output buffer of claim 1, wherein the control unit is utilized for controlling the first transistor and the second transistor to conduct at different times.

9. An output buffer for an electronic device comprising:
   a first logic unit comprising a first terminal, a second terminal coupled to a power supply terminal, and a third terminal, for controlling an electrical connection between the second terminal of the first logic unit and the third terminal of the first logic unit according to an input signal from the first terminal of the first logic unit;
   a second logic unit comprising a first terminal coupled to the first terminal of the first logic unit, a second terminal coupled to a ground terminal, and a third terminal, for controlling an electrical connection between the third terminal of the second logic unit and the second terminal of the second logic unit according to the input signal from the first terminal of the second logic unit;
   a first transistor comprising a first terminal coupled to the third terminal of the first logic unit, a second terminal coupled to a power supply terminal, and a third terminal, for controlling an electrical connection between the second terminal of the first transistor and the third terminal of the first transistor according to a signal from the first terminal of the first transistor;
   a second transistor comprising a first terminal coupled to the third terminal of the second logic unit, a second terminal coupled to the ground terminal, and a third terminal, for controlling an electrical connection between the third terminal of the second transistor and the second terminal of the second transistor according to a signal from the first terminal of the second transistor; and a control unit for controlling a conduction order of the first transistor and the second transistor, comprising:

a first PMOS transistor having a source coupled to the third terminal of the first logic unit, a drain and a gate;

a second PMOS transistor comprising a source coupled to the drain of the first PMOS transistor, a drain coupled to the third terminal of the second logic unit, and a gate, for controlling an electrical connection between the source and the drain of the second PMOS transistor according to a first control signal;

a first NMOS transistor comprising a source coupled to the gate of the first PMOS transistor, a drain coupled to the third terminal of the first logic unit, and a gate, for controlling an electrical connection between the drain and the source of the first NMOS transistor according to a second control signal; and a second NMOS transistor comprising a source coupled to the third terminal of the second logic unit, a drain coupled to the source of the first NMOS transistor, and a gate coupled to the drain of the first PMOS transistor.

10. The output buffer of claim 9, further comprising an input terminal coupled to the first terminal of the first logic unit and the first terminal of the second logic unit, for generating the input signal.

11. The output buffer of claim 9, further comprising an output terminal coupled to the third terminal of the first logic unit and the third terminal of the second logic unit, for generating an output signal.

12. The output buffer of claim 9, wherein the first logic unit is a PMOS transistor having a gate as the first terminal of the first logic unit, a source as the second terminal of the first logic unit, and a drain as the third terminal of the first logic unit.

13. The output buffer of claim 9, wherein the second logic unit is an NMOS transistor having a gate as the first terminal of the second logic unit, a source as the second terminal of the second logic unit, and a drain as the third terminal of the second logic unit.

14. The output buffer of claim 9, wherein the first transistor is a PMOS transistor having a gate as the first terminal of the first transistor, a source as the second terminal of the first transistor, and a drain as the third terminal of the first transistor.

15. The output buffer of claim 9, wherein the second transistor is an NMOS transistor having a gate as the first terminal of the second transistor, a source as the second terminal of the second transistor, and a drain as the third terminal of the second transistor.

16. The output buffer of claim 9, wherein the control unit is utilized for controlling the first transistor and the second transistor to conduct at different times.

17. The output buffer of claim 9, wherein the first control signal is generated by a voltage generator.

18. The output buffer of claim 9, wherein the second control signal is generated by a voltage generator.

19. The output buffer of claim 9, wherein the first control signal and the second control signal are at different voltage levels.

20. The output buffer of claim 19, wherein the output buffer has a high impedance output when the first control signal is at a high voltage level and the second control signal is at a low voltage level.

* * * * *